United States Patent [19]
Andrews et al.

[11] Patent Number: 5,432,535
[45] Date of Patent: Jul. 11, 1995

[54] METHOD AND APPARATUS FOR FABRICATION OF MULTIBEAM LASERS

[75] Inventors: John R. Andrews, Fairport; Narayan V. Deshpande, Penfield, both of N.Y.

[73] Assignee: Xerox Corporation, Stamford, Conn.

[21] Appl. No.: 992,681

[22] Filed: Dec. 18, 1992

[51] Int. Cl.⁶ .................. G01D 15/04; G01D 15/10
[52] U.S. Cl. .................................................. 347/242
[58] Field of Search ............... 346/108, 160; 357/70, 357/81; 428/209, 216; 455/617; 331/94.5 H; 372/50; 174/16 HS; 350/6.8; 385/89, 142; 330/286; 356/350

[56] References Cited

U.S. PATENT DOCUMENTS

| | | | |
|---|---|---|---|
| 4,293,826 | 10/1981 | Scifres et al. | 331/945 H |
| 4,393,387 | 7/1983 | Kitamura | 346/108 |
| 4,404,571 | 9/1983 | Kitamura | 346/108 |
| 4,420,761 | 12/1983 | Kitamura | 346/108 |
| 4,445,126 | 4/1984 | Tsukada | 346/108 |
| 4,474,422 | 10/1984 | Kitamura | 350/6.8 |
| 4,582,954 | 4/1986 | Eaton et al. | |
| 4,796,964 | 1/1989 | Connell et al. | 350/6.8 |
| 4,884,857 | 12/1989 | Prakash et al. | 350/6.8 |
| 4,892,371 | 1/1990 | Yamada et al. | 350/6.8 |
| 4,969,137 | 11/1990 | Sugiyama et al. | 369/32 |
| 5,010,388 | 4/1991 | Sasame et al. | |
| 5,060,237 | 10/1991 | Peterson | 372/50 |
| 5,213,877 | 5/1993 | Yoshida et al. | |
| 5,638,508 | 1/1987 | Hintz et al. | |

OTHER PUBLICATIONS

"Temperature Dependence of the Threshold Current for InGa AIP Visible Laser Diodes"; IEEE Journal of Quantum Electronics, vol. 27; No. 1, pp. 23-29; 1991.

*Primary Examiner*—Benjamin R. Fuller
*Assistant Examiner*—Raquel Yvette Gordon
*Attorney, Agent, or Firm*—Duane C. Basch

[57] ABSTRACT

The present invention is a multispot laser light source assembled from at least two individual laser diodes in accordance with a design model. The multispot laser includes at least two semiconductor laser diodes, both of which are permanently affixed to a chip carrier. The chip carrier rigidly supports the diodes and conducts heat away from the the diodes to be dissipated by a heat sink. The present invention is further characterized by a predefined relationship between the chip carrier material, the relative dimensions of the chip carrier, and the separation distance of the diodes from the heatsink, which results in significant reduction in the thermal droop and crosstalk between the diodes.

25 Claims, 6 Drawing Sheets

METHOD AND APPARATUS FOR FABRICATION OF MULTIBEAM LASERS

This invention relates generally to a raster output scanning apparatus for a printing machine, and more particularly to a multibeam laser constructed from a plurality of laser diodes in accordance with a predetermined design rule.

CROSS REFERENCE

The following related applications are hereby incorporated by reference for their teachings:

U.S. patent application No. 07/948,530 to James Appel et al., entitled "A Raster Output Scanner for a Multi-Station Xerographic Printing System Having Laser Diodes Arranged In a Line Parallel to the Fast Scan Direction", filed Sep. 22, 1992;

U.S. patent application No. 07/948,531 to Thomas L. Paoli, entitled "Diode Laser Multiple Output Scanning System", filed Sep. 22, 1992;

U.S. patent application No. 07/928,511 to John R. Andrews, entitled "Raster Output Scanning Arrangement for a Printing Machine", filed Sep. 22, 1992; and U.S. patent application No. 07/992,686 to John R. Andrews, entitled "Multiple Diode Laser Employing Mating Substrates", filed concurrently herewith.

BACKGROUND AND SUMMARY OF THE INVENTION

The present invention is directed to flying spot scanners (commonly referred to as raster output scanners (ROSs)) which typically have a reflective multifaceted polygon mirror that is rotated about its central axis to repeatedly sweep one or more intensity modulated beams of light across a photosensitive recording medium in a line (fast-scanning direction). While the beams sweep across the photosensitive recording medium, it is advanced in an orthogonal or "process" direction, commonly referred to as the slow-scan direction, such that the beams scan the recording medium in accordance with a raster scanning pattern. Printing is performed by serially modulating the intensity of each of the beams in accordance with a binary sample stream, whereby the recording medium is exposed to the image represented by the samples as it is being scanned.

Printers that sweep several beams simultaneously are referred to as multibeam or multispot printers. Moreover, dual or multispot lasers are considered to be an enabling technology for high speed printers operating at resolutions of about 600 spots per inch (spi) while producing output at greater than 80 pages per minute (ppm). Monolithic laser arrays, while providing the multispot capability, have typically been strongly sensitive to thermal droop and crosstalk when used in closely spaced lasers having interbeam spacings of less than 250 μm.

The following disclosures, relating to both ROS printing devices and multibeam laser diodes, may be relevant:

U.S. Pat. No. 5,060,237 Patentee: Peterson Issued: Oct. 22, 1992
U.S. Pat. No. 4,892,371 Patentee: Yamada et al. Issued: Jan. 9, 1990
U.S. Pat. No. 4,884,857 Patentee: Prakash et al. Issued: Dec. 5, 1989
U.S. Pat. No. 4,796,964 Patentee: Connell et al. Issued: Jan. 10, 1989
U.S. Pat. No. 4,474,422 Patentee: Kitamura Issued: Oct. 2, 1984
U.S. Pat. No. 4,445,126 Patentee: Tsukada Issued: Apr. 24, 1984
U.S. Pat. No. 4,420,761 Patentee: Kitamura Issued: Dec. 13, 1983
U.S. Pat. No. 4,404,571 Patentee: Kitamura Issued: Sep. 13, 1983
U.S. Pat. No. 4,393,387 Patentee: Kitamura Issued: Jul. 12, 1983
U.S. Pat. No. 4,293,826 Patentee: Scifres et al. Issued: Oct. 6, 1981

The relevant portions of the foregoing disclosures may be briefly summarized as follows:

U.S. Pat. No. 5,060,237 discloses a laser diode array including a plurality of laser diode bodies affixed to a surface of a substrate. Each of the laser bodies includes a semiconductor junction therein which is capable of generating light in response to a voltage potential. An end surface of the body is angled at a forty-five degree angle so as to reflect the light generated by the diode in a direction which is orthogonal to the surface of the substrate.

U.S. Pat. No. 4,892,371 describes a semiconductor laser array light source and scanner wherein the laser light source emits one or more pairs of light beams. The light beams are collimated by a collimating lens and are subsequently directed along separate paths. Additional optical means are used to transmit or reflect certain of the light beams to one or more incident surfaces of the optical means so as to align the beams by controlling the angle of incidence and beam separation at a photosensitive surface.

U.S. Pat. No. 4,884,857 teaches a multiple spot printer which employs a laser system having multiple semiconductor lasers, an aperture plate, and an optical system as shown in FIGS. 4 and 5. Control of the spot locations at the surface of the photoconductor is achieved in two planes, first, using an aperture plate in the process plane, and second, using a single aperture plate in the scan plane.

U.S. Pat. No. 4,796,964 describes a method for using a multiple emitter solid state semiconductor laser in a raster output scanner. The overlapping beams are sequenced in ON/OFF operation to avoid any interbeam interference in a manner that assures that only one laser beam will be on at any given time. Hence, nonuniformity caused by optical interference of overlapping beams is prevented without the need for further modification of the optical properties of the beams (e.g., polarization and wavelength).

U.S. Pat. No. 4,474,422 discloses an optical scanning apparatus having a light source consisting of an array of aligned light sources. The beams from the light sources are collimated and deflected to sweep across a single photoreceptor. The beams are also displaced from each other in the cross-scan direction so that multiple lines can be scanned simultaneously across the photoreceptor. An object of U.S. Pat. No. 4,474,422 is to reduce variations in pitch by closely spacing individual lasers within the laser array in a compact structure.

U.S. Pat. No. 4,445,126 teaches an image forming apparatus which uses a plural beam source to scan a recording medium. The apparatus further includes an optical system for reducing the distance between the plural light beams at the surface of the recording medium. As illustrated (FIG. 4), a mirror having plural faces, angled so as to direct the outermost beams toward the imaging location, is used to increase the recording density on the surface of the recording medium.

U.S. Pat. No. 4,420,761 discloses a recording apparatus having plural dots arranged inclined to the scanning direction in order to increase the dot or scanning density. The phase difference caused by such inclination of a semiconductor laser array is compensated for using delay circuitry to generate a delay in the driving signals for the plural laser beams in accordance with the offset caused by the inclination.

U.S. Pat. No. 4,404,571 describes a multibeam recording apparatus comprising a scanner for scanning a recording medium with a plurality of light beams and a beam detector. The scanner employs a laser array light source having a plural number of semiconductor lasers arranged in a row. The beam detector utilizes a screen plate with a detection aperture which is smaller than the inter-beam spacing to individually detect each of the plural beams.

U.S. Pat. No. 4,393,387 teaches a beam recording apparatus including a semiconductor array laser light source having a plurality of light beam emitting points, a condensing optical system, an image rotator, and a rotatable polygon mirror for deflecting the light beams to the surface of a photosensitive drum. High density recording is enabled by controlling the angle of incidence, and therefore the interbeam spacing, of the outermost beams at the surface of the photosensitive drum.

U.S. Pat. No. 4,293,826 discloses a semiconductor injection laser having an optical feedback control incorporated within the same semiconductor chip. Stabilization of the of the laser output is accomplished by monitoring a portion of the light output with an optical detector, which then drives a feedback circuit to control the laser current. The patent further describes a hybrid semiconductor laser/detector arrangement which implements an array of laser/detector pairs on a single semiconductor substrate.

The relevant portions of the above-cited references are hereby incorporated by reference for their teachings.

In accordance with the present invention, there is provided a multispot laser, comprising a pair of laser diodes, means for supporting said laser diodes on opposed sides thereof, said supporting means conducting thermal energy generated during the operation of said laser diodes away from said laser diodes, and means, coupled to said supporting means, for dissipating the thermal energy.

In accordance with another aspect of the present invention, there is provided a printing machine having a photoreceptor which is exposed by a raster output scanning arrangement. The scanning arrangement comprises: a multispot laser, including first and second laser diodes for producing first and second beams, respectively; means for supporting said first and second laser diodes on opposed sides thereof, said supporting means conducting thermal energy generated during the operation of said laser diodes away from said laser diodes; and means, coupled to said supporting means, for dissipating the thermal energy. The raster output scanning arrangement further includes means for deflecting the first and second beams into an optical path, and means for directing the first and second beams toward a surface of the photoreceptor.

The present invention will be described in connection with a preferred embodiment, however, it will be understood that there is no intent to limit the invention to the embodiments described. On the contrary, the intent is to cover all alternatives, modifications, and equivalents as may be included within the spirit and scope of the invention as defined by the appended claims.

DESCRIPTION OF THE PREFERRED EMBODIMENT

Figure 1:
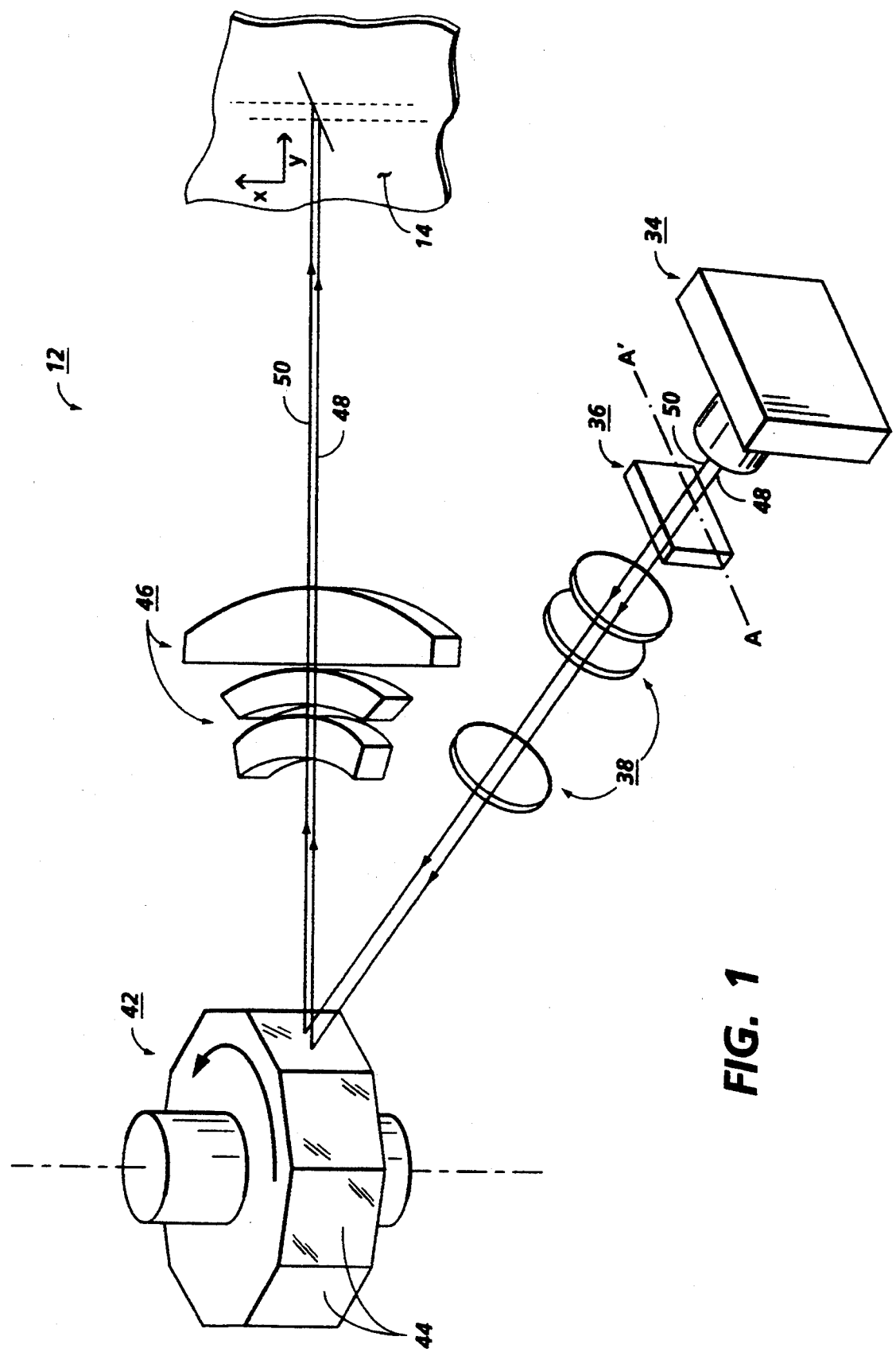
FIG. 1 is a perspective view illustrating the optical elements incorporated within a dual beam ROS, namely a light source, a polarization control system, a beam forming optics system, a deflector and a corrective optical system.

For a general understanding of the present invention, reference is made to the drawings. In the drawings, like reference numerals have been used throughout to designate identical elements. FIG. 1 shows portions of a ROS printing system 12, which produces at least two separate output scanning beams to sweep in the X-direction and expose the photoresponsive surface of belt 14, which is being driven in the process, or Y-direction.

The ROS printing system employs a light generating device 34, which, as shown in the following Figures can comprise a plurality of relatively closely spaced laser diodes, 56. Typically, the laser diodes are separated from one another by a distance which is at least 25 μm. In one example, the light generating device emits two laser beams 48 and 50, which may have different wavelengths, for example, 650 nm and 685 nm, respectively. Light generating device 34 effectively provides a substantially common spatial origin for each beam. Furthermore, each beam is independently modulated so that it exposes the photoreceptor belt in accordance with a respective digitized image.

Still referring to FIG. 1, the laser beams from device 34 are input to a segmented waveplate 36, and then optics system 38, which preferably includes a collimator lens to direct the beams onto an optical path such that they illuminate the deflector 42, which, in one example, comprises a rotating polygon mirror having a plurality of facets 44. As the polygon mirror rotates, the facets cause the reflected beams to deflect repeatedly for input to the correction optical system 46, which focuses the beams and corrects for errors such as polygon angle error and wobble prior to transmitting the beams to the surface of photoreceptor belt 14.

Figure 2:
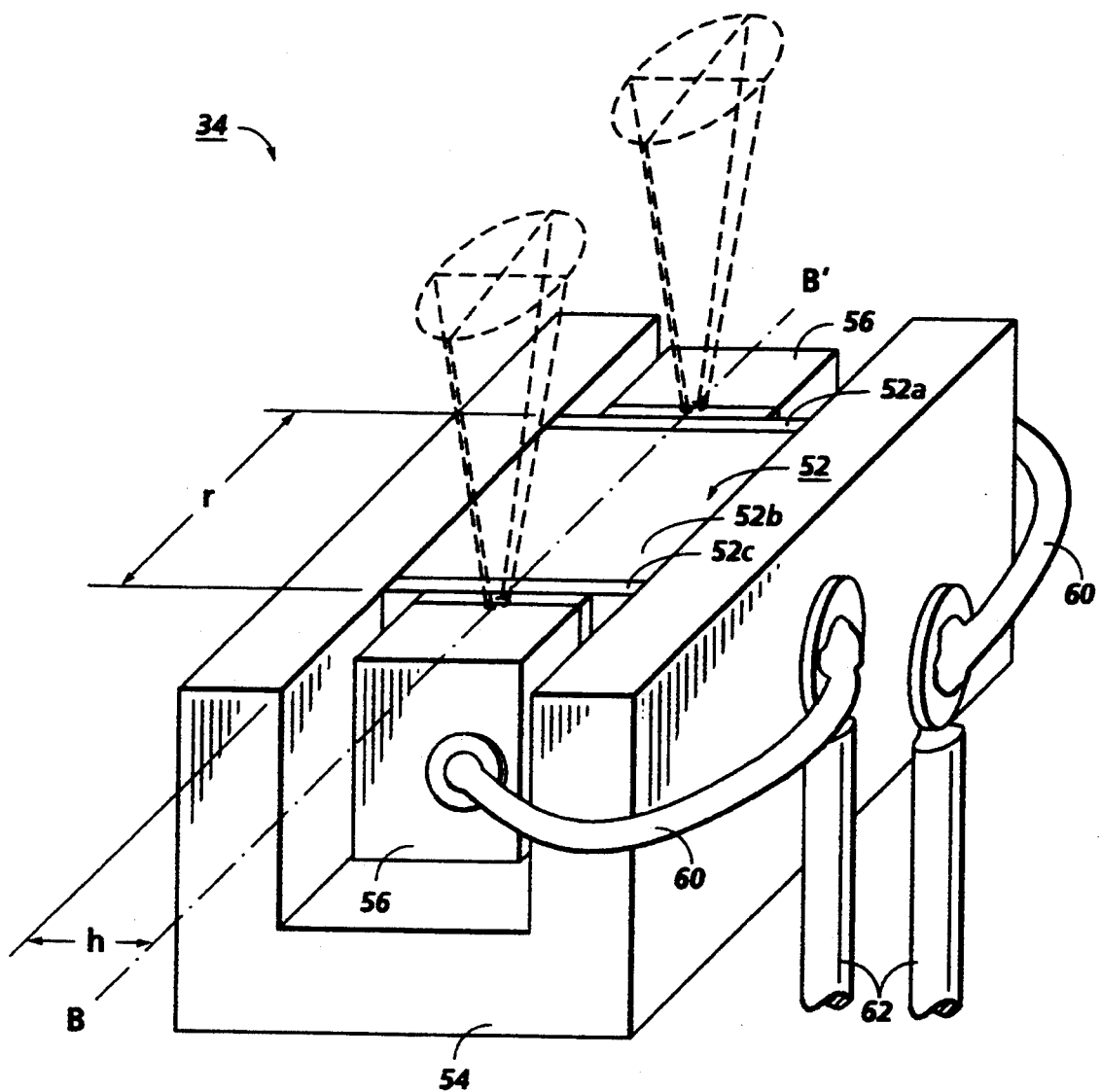
FIG. 2 is a perspective view of the dual diode light source of FIG. 1 illustrating one embodiment of the present invention.
Figure 3:
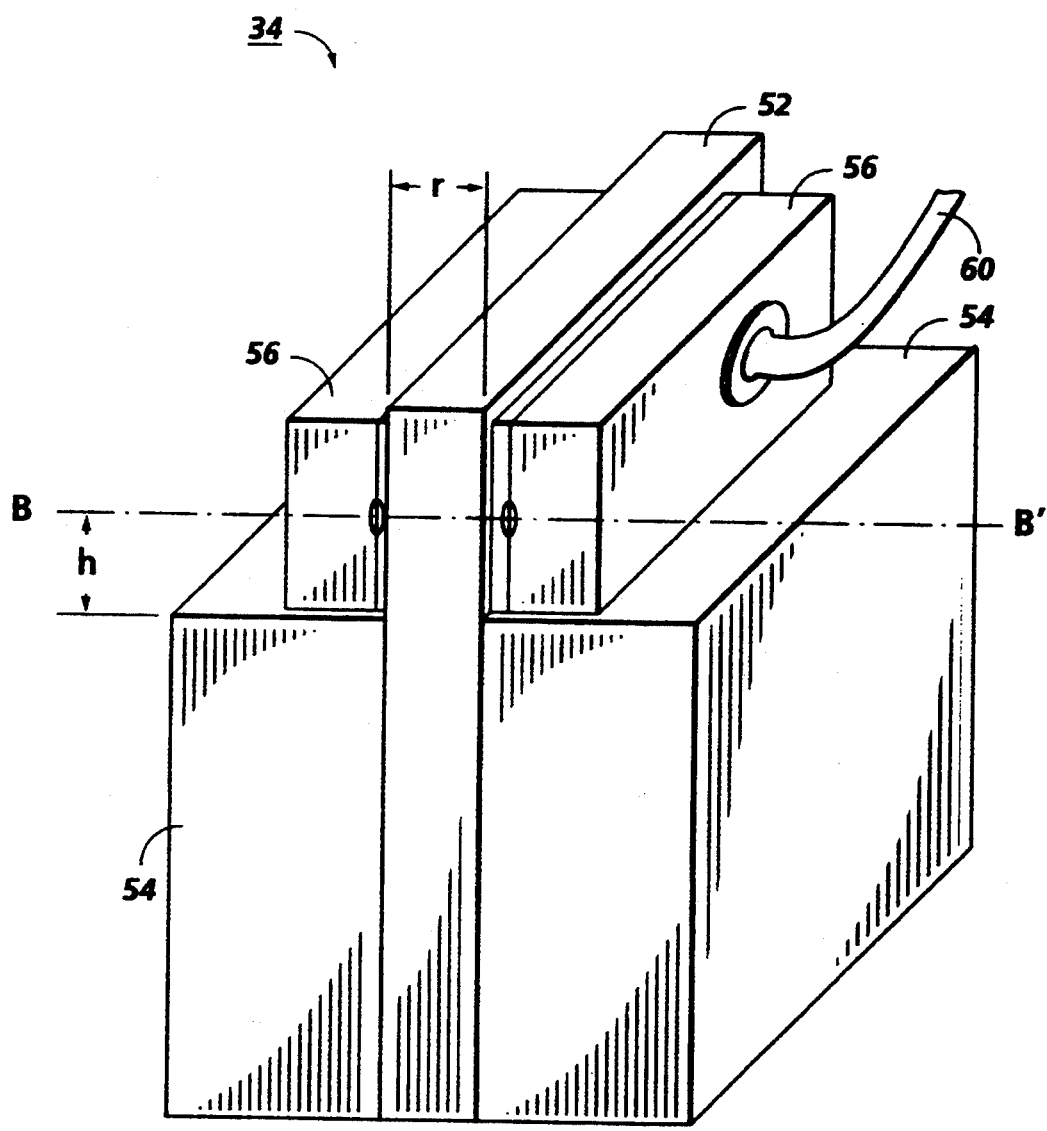
FIG. 3 is another perspective view of the dual diode light source illustrating an alternative embodiment of the present invention.

Turning now to FIGS. 2 and 3, where two different embodiments of a dual spot light generating device 34 are shown, the dual spot device is comprised of a support member, referred to as a chip carrier, 52, a heatsink 54 and at least two semiconductor laser diodes, 56.

Although the laser diodes depicted are single spot diodes, such as the Toshiba 9215 laser diode, it is also possible to utilize dual or multispot monolithic semiconductor diodes as well. Chip carrier 52 is a rigid sheet of material sandwiched between the laser diodes 56. The primary functions of the chip carrier are to support the diodes and to conduct as much heat as possible away from the laser diodes so as to minimize or eliminate thermal droop and crosstalk effects which negatively impact the operation of the diodes. Accordingly, the chip carrier is preferably formed from a thermally conductive material having a thickness r, such as, diamond, copper, beryllium-oxide (BeO), or silicon. While the model described herein characterizes the performance of these four alternative chip carrier materials, other materials such as CVD synthetic diamond and Aluminum Nitride are equally suitable for use in the chip carrier, as are other equivalent materials which exhibit similar properties. These materials should be readily available in thicknesses as small as 25 μm, and easily shaped for subsequent mounting in, or attachment to, the heatsink. Moreover, considerations such as the cost, process compatibility, and the thermal coefficient of expansion for the material, relative to the laser diode and heat sink to which it is attached, would be weighed in selecting an appropriate material.

The chip carrier may also provide the electrical contact to the junction side of laser diode 56 as illustrated on FIG. 12. Thus, use of a dielectric material for the are of the chip carrier 152b, could also require the plating or cladding of an electrically conductive layers 52a and 52c to the outer, or contact, surfaces of the carrier to form a laminated chip carrier 52 having electrically conductive outer surfaces. Two separate single spot or monolithic multispot lasers, 56 as illustrated in FIG. 2, are mounted with their emitters, or output facets, spaced at a distance h away from the heatsink. The junction sides of each diode are in contact with the opposing sides of chip carrier 52, although an inverted arrangement, where the substrate side of the diode contacts the chip carrier, may be used as well. The diodes are permanently affixed to the chip carrier by a soldering operation, and are positioned such that a line connecting the laser emitters, B-B', is approximately perpendicular to the longitudinal axis of the chip carrier. In one embodiment, illustrated by FIG. 2, heat sink 54 extends close to the laser diodes on both the sides and the rear. In another embodiment, illustrated in FIG. 3, the large area chip carrier is soldered between two larger copper blocks that serve as the heat sink. The large contact area between the chip carrier and the heatsink minimizes the thermal resistance at that junction and improves the transfer of heat from the chip carrier to be dissipated by the heat sink. As illustrated by the Figures, the chip carrier is laminated between two heat sink blocks 54, as shown in FIG. 3, or the chip carrier can be embedded or soldered in a pre-existing cavity within the heat sink (FIG. 2), as might be done for a diamond chip carrier. Once the diodes are permanently affixed to opposite sides of the chip carrier, wire-bonds 60 can be used to make independent electrical contact between each laser diode, 56, and an external contact, 62, which provides driving power to said diode.

While the thickness r of the chip carrier may be varied in the disclosed embodiments, practical considerations such as the rigidity of the support, which is a function of the thickness and the distance h, limit the minimal thickness to approximately 25 μm. Moreover, in order to improve the thermal conductivity of the chip carrier, as will be hereafter described, it is desirable to increase the thickness of the chip carrier. Although increased chip carrier thickness necessarily increases the beam separation distance, numerous methods are known to subsequently reduce the beam separation in the scanning direction and to increase the recording density of the separated beams. For example, U.S. Pat. No. 4,445,126 to Tsukada and U.S. Pat. No. 4,474,422 to Kitamura, both of which have been previously incorporated by reference, disclose two alternative methods to reduce the separation between plural light beams. Similarly, U.S. Pat. No. 4,969,137 to Sugiyama et al. (issued Nov. 6, 1990), hereby incorporated by reference for its teachings, discloses a mechanical system for adjusting the relative positions of the spots of a multi-spot exposure system.

Turning now to a model of the described embodiments, typically, the electrical power dissipation, $P_{el}$, of the laser depends on the current i, the diode forward voltage $V_f$ and the series resistance $\Omega_{series}$, in accordance with the following equation, including the parameters described in Table 1:

$$P_{el} = iV_f + i^2\Omega_{series} = iV_{op} \qquad \text{Eq. 1}$$

TABLE 1

| Parameter | Description | units |
|---|---|---|
| $V_f$ | diode forward voltage | V |
| $\Omega_{series}$ | series electrical resistance | Ω |
| $V_{op}$ | laser operating voltage | V |
| $P_{el}$ | electrical power | W |

For simplicity, it was assumed that all electrical power is converted to heat energy, whereas under normal circumstances, above a certain threshold level some of the operating power is converted to light energy. Thus, the simple model presented hereinafter will tend to overestimate the thermal heat load relevant to droop and crosstalk by as much as thirty percent when a continuous power bias is applied to achieve the laser threshold and a pulsed power is applied to raise the power to the operating optical power. Although simplified, the following model allows a determination of the basic guidelines necessary to construct a simple design rule for the chip carrier embodiment of the multidiode laser.

Analytical modeling enables the determination of the key parameters in designing the dual spot laser embodiments previously described. The following model uses a lumped-element heat conduction analysis for the embodiment illustrated in FIG. 3, including the two semiconductor laser diodes as heat sources, and assuming that the chip carrier is attached to a semi-infinite heat sink. A calculated temperature rise was used to calculate the change in laser threshold and differential quantum efficiency. Subsequently, these values are used to calculate the laser power crosstalk and make a determination of the behavior of the design with various chip carrier materials. The model allows the development of a simple design rule for the spacing ratio, r/h,, such that the crosstalk will be maintained below 1%. The various parameters used in the thermal model are briefly summarized in Table 2.

TABLE 2

| Parameter | Description | units |
|---|---|---|
| k | thermal conductivity | W/(cm·°C.) |
| $pc_p$ | heat capacity at constant pressure | J/(cm$^3$·°C.) |
| T-T$_{sink}$ | temperature rise of the carrier | °C. |
| R$_{th}$ | thermal resistance | °C./W |
| C | thermal capacity | J/°C. |
| P | electrical power dissipation | W |
| h | distance of heat source to heatsink | cm |
| A | area of chip carrier contact with heatsink | cm$^2$ |
| V | volume of chip carrier not in contact with heatsink | cm$^3$ |
| S | distance of heat diffusion | cm |
| D | heat diffusion coefficient | cm$^2$/s |
| t | time following application of current pulse | s |
| r | thickness of chip carrier | cm |
| l | length of chip carrier contact with heatsink | cm |
| Δt | delay time between pulse to laser 1 and heating of laser 2 | s |

The time dependence of the heat rise of the chip carrier, at the laser diode, is determined by Equation 2 as follows: The temperature of the carrier rises from the heatsink temperature, T$_{sink}$, to the steady state temperature, T, in an exponential fashion. The thermal resistance of the chip carrier—heatsink contact area, R$_{th}$, determines the amount of heat dissipated from the chip carrier to the heatsink, where:

$$T - T_{sink} = R_{th}P_{el}(1 - e^{-\frac{t}{R_{th}C}}) \quad \text{Eq. 2}$$

$$R_{th} = \frac{h}{kA} \quad \text{Eq. 3}$$

The rate of temperature rise is determined by the rate that heat is dissipated from the chip carrier to the heatsink, and the total heat capacity of the chip carrier, with $$A = rl \quad \text{Eq. 4}$$

$$C = pc_p V \quad \text{Eq. 5}$$

and where the volume of the chip carrier through which the heat is conducted, V, is represented as $$V = rl(2h) \quad \text{Eq. 6}$$

The mean square displacement (S$^2$) of the temperature rise follows the heat diffusion equation:

$$S^2 = \frac{1}{2} Dt, \quad \text{Eq. 7}$$

where the heat diffusion coefficient, D, is determined as a function of the ratio of the two fundamental materials parameters for the chip carrier, thermal conductivity and heat capacity, as follows:

$$D = 2\frac{k}{pc_p}. \quad \text{Eq. 8}$$

From the equations above one can obtain the following relation for the thermal time constant R$_{th}$C:

$$R_{th}C = \frac{h^2}{D} \quad \text{Eq. 9}$$

Table 3 gives the fundamental materials parameters for heat conduction of the four materials considered as possible chip carriers, as well as and some derived values.

TABLE 3

| Material | k | pc$_p$ | D | 1/kαR$_{th}$ | 1/DαR$_{th}$C |
|---|---|---|---|---|---|
| Diamond (IIA) | 20 | 1.81 | 22.1 | 0.05 | 0.045 |
| OFHC Cu | 3.98 | 3.44 | 2.3 | 0.25 | 0.43 |
| BeO | 2.9 | 3.13 | 1.9 | 0.33 | 0.53 |
| Si | 1.41 | 1.63 | 1.7 | 0.71 | 0.59 |

In order to properly represent the effects of the crosstalk on the laser diodes, commonly seen as a decrease in intensity as the temperature of the diode rises, it is also necessary to model the performance of the laser diodes as a function of temperature. The temperature dependence of the power output of InGaAlP laser diodes has been studied by Toshiba and reported in the paper by M. Ishikawa et al., *Temperature Dependence of the Threshold Current for InGaAlP Visible Laser Diodes*, IEEE *Journal of Quantum Electronics*, Vol. 27, No. 1, pp. 23–29 (1991), which is hereby incorporated by reference for its teachings. The data and the laser power change model are used below to derive the temperature dependent change in the light output of the laser diodes, using the parameters described in Table 4.

The temperature responsive threshold current change follows the form:

$$J_{thresh.}(T) = J_{thresh.}(T_1) \cdot e^{(T-T_1)/T_{0g}} \cdot e^{(T-T_1)/T_{0\eta}}, \quad \text{Eq. 10}$$

and the change in the external differential quantum efficiency above T$_1$ = 0° C. follows as approximately, $$\eta_{ex} = \eta_{ex}(T_1) \cdot e^{(T-T_1)/T_{0\eta}}. \quad \text{Eq. 11}$$

TABLE 4

| Parameter | Description | Value |
|---|---|---|
| J$_{thresh.}$(T) | threshold current (temperature-dependent) | mA |
| T | actual laser junction temperature | °C. |
| T$_1$ | reference laser junction temperature before current pulse | °C. |
| T$_{0g}$ | characteristic temperature for gain parameters | ° |
| T$_{0\eta}$ | characteristic temperature for differential quantum efficiency | ° |
| P(T) | laser power (temperature-dependent) | mW |
| ΔP$_{op}$ | percent power change | % |
| η$_{ex}$(T) | external differential quantum efficiency | mW/mA |

This leads to the following expression for the temperature dependence of the optical power, P$_{op}$:

$$P_{op}(T) = [J - J_{thresh.}(T)] \cdot \eta_{ex}, \quad \text{Eq. 12}$$

and the percentage power change may then be represented as $$\Delta P_{op}(\%) = 100 \cdot \frac{P(T) - P(T_1)}{P(T_1)}. \quad \text{Eq. 13}$$

In order to evaluate the model, a Toshiba 9215 laser diode was first characterized. Table 5 summarizes the electrical parameters of a Toshiba 9215 laser diode, and the maximum peak electrical power consumption for two different cases. The first being a completely current modulated case where the laser is pulsed between zero current and a desired optical operating power, where the peak electrical power is represented as $P_{el1}$. The second case is where the laser is operated by offsetting the current to the diode threshold level, cw, and then pulsed to the desired optical operating power, represented below as $P_{el2}$. More specifically, case 2 was used in the development of the simple design rule based upon the understanding that the bias current operation of the laser diodes is the more desirable mode of operation in order to minimize thermally-induced droop and crosstalk. Subsequently, the laser diodes

TABLE 5

Figure 4:
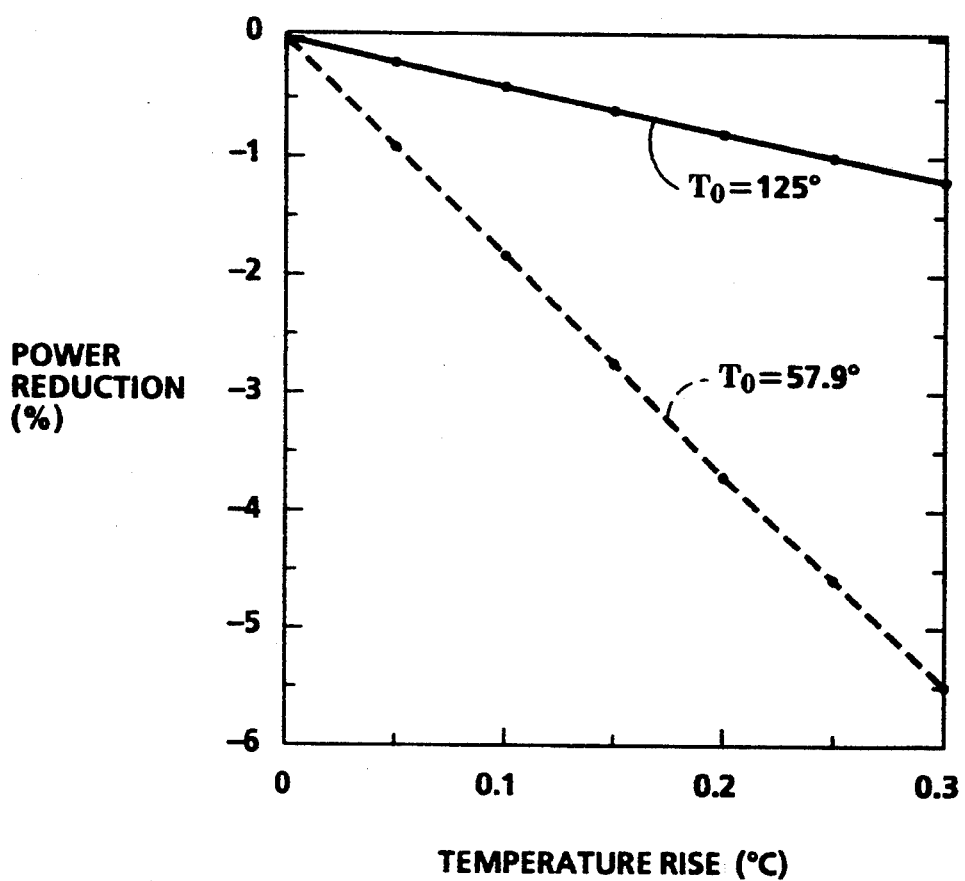
FIG. 4 is a graph illustrating the effects of thermal crosstalk on the power output of a laser diode as a function of temperature increase.

| Toshiba 9215 | i | $V_f$ | $\Omega_{series}$ | $P_{el1}$ | $P_{el2}$ |
|---|---|---|---|---|---|
| Threshold | 45 mA | 2 Volts | 7.5 $\Omega$ | — | — |
| 10 mW | 55 mA | 2 Volts | 7.5 $\Omega$ | 0.19 W | 0.09 W | were analyzed to determine relevant characteristics for inclusion in the laser power change model equations, Equations 10–13 above. The predicted thermal crosstalk behavior is illustrated in FIG. 4 for two values of $T_{og}$, showing an anticipated reduction in the power output in response to an increase in operating temperature. The thermal parameter $T_{og}=57.9°$ was derived from the Ishikawa, et al. reference, previously incorporated herein, and might be taken as a representative value for a visible wavelength AlGaInP semiconductor laser. The thermal parameter $T_{og}=125°$ was also used to examine the temperature sensitivity to droop and crosstalk of lower thermal sensitivity lasers. The lower level of thermal sensitivity is characteristic of near-infrared AlGaAs semiconductor lasers and might evolve from improvements in visible wavelength AlGaInP semiconductor lasers.

Subsequently, two alternate chip carrier configurations were analyzed with the models, each using the four previously indicated chip carrier materials, diamond (IIA), copper, beryllium-oxide, and silicon, having the properties indicated in Table 3. In the first example, a chip carrier thickness of 200 μm was assumed, a distance from the diode to the heatsink of 50 μm, the length of the chip carrier contact with the heatsink equal to 500 μm, and the power dissipation of the laser diode to be 0.09 watts. Utilizing these assumptions, some of the values for the relevant parameters may be found in Table 6, while the predicted crosstalk

TABLE 6

Figure 5:
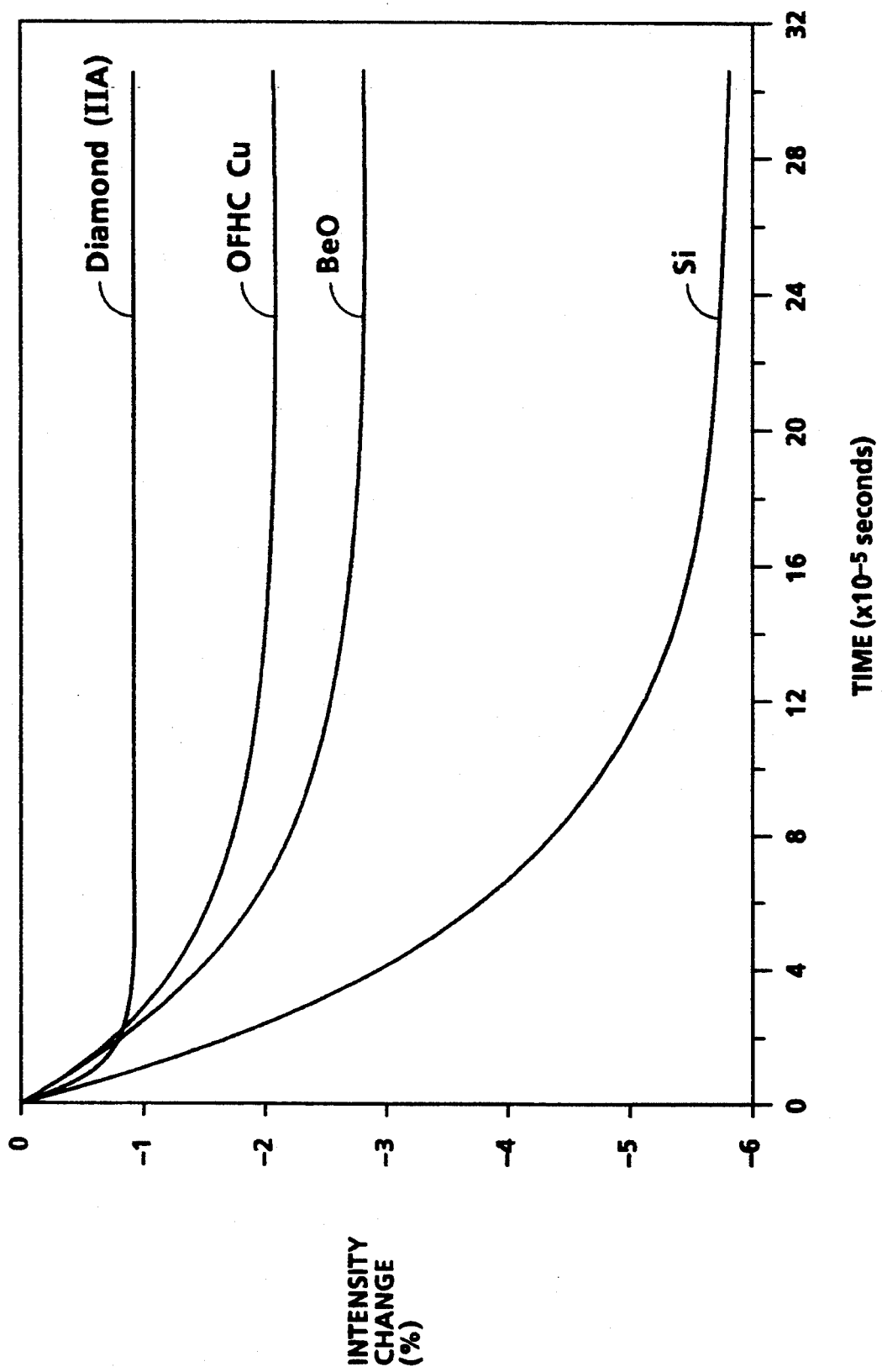
FIGS. 5 and 6 are graphical representations of empirical data illustrating the performance of various materials considered for use in the embodiments depicted in FIGS. 2 and 3.

| Material | $R_{th}$ | $R_{th}P_{el}$ | $R_{th}C \times 10^{-3}$ | $\Delta t \times 10^{-3}$ |
|---|---|---|---|---|
| Diamond (IIA) | 0.56 | 0.05 | 0.010 | 0.056 |
| OFHC Cu | 2.8 | 0.25 | 0.34 | 0.54 |
| BeO | 3.9 | 0.35 | 0.42 | 0.67 |
| Si | 7.9 | 0.71 | 0.45 | 0.72 | r = 200 μm, h = 50 μm, l = 500 μm, $P_{el}$ = 0.09 W behavioral effects are illustrated in the graph shown in FIG. 5.

The second example altered the spacing assumptions so that the chip carrier thickness was 800 μm, the distance from the diode to the heatsink 200 μm, and the length of the chip carrier contact with the heatsink remained equal to 500 μm. Applying the second set of assumptions produced the parameter values listed in Table 7 for the various

TABLE 7

Figure 6:
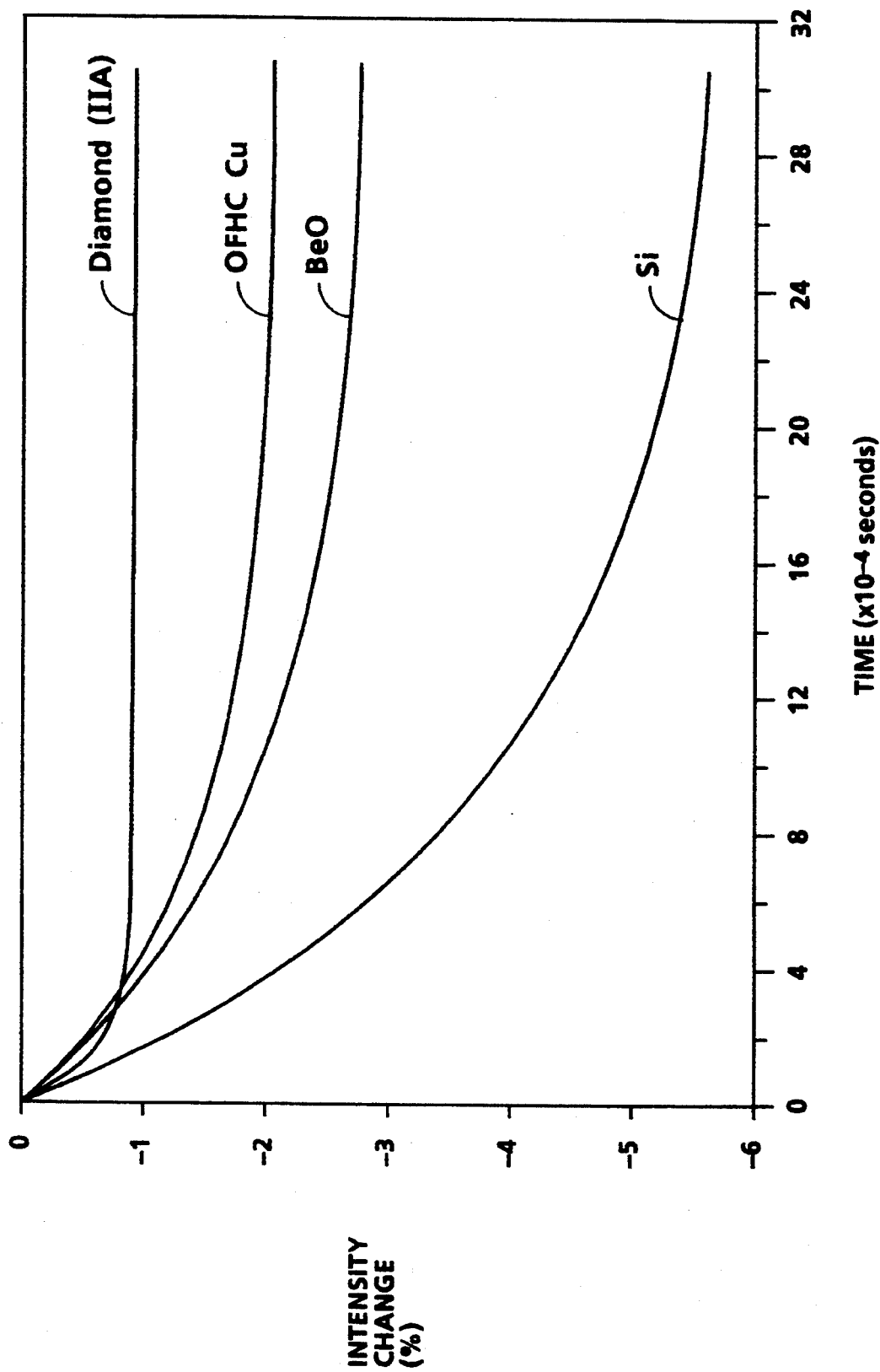

| Material | $R_{th}$ | $R_{th}P_{el}$ | $R_{th}C \times 10^{-3}$ | $\Delta t \times 10^{-3}$ |
|---|---|---|---|---|
| Diamond (IIA) | 0.25 | 0.023 | 0.072 | 0.58 |
| OFHC Cu | 1.26 | 0.11 | 0.69 | 5.53 |
| BeO | 1.72 | 0.16 | 0.86 | 6.91 |
| Si | 3.55 | 0.32 | 0.92 | 7.40 | r = 800 μm, h = 200 μm, l = 500 μm, $P_{el}$ = 0.09 W materials, and the results of the modeling are illustrated graphically in FIG. 6.

As a result of the modeling, it was determined that for chip carriers of diamond, OFHC Cu (Oxygen-free high conductivity Copper), BeO, and Si the spacing ratio r/h, should be greater than or equal to 4, 9, 12, and 26, respectively, for a pulse current providing 10 mW of optical output to one laser while the other laser operates at 5 mW (continuous) prior to pulsing the second laser, in order to limit the crosstalk effect to one-percent or less. For example, in a diamond chip carrier, this design rule translates to a laser spacing r of 200 μm if the lasers can be placed on the chip carrier a distance h, of 50 μm from the heatsink. If active power control of the laser diodes is used, thereby decreasing the heat generated by the individual diodes, this rule can be relaxed, at least in the cases where the thermal time constants are longer than the time constant for the active power control.

In recapitulation, the present invention is a multispot laser light source assembled from at least two individual laser diodes, which are permanently affixed to a chip carrier that conducts heat away from the junction side of the diodes to be dissipated by a heat sink. The present invention is further characterized by a predefined relationship between the chip carrier material, the relative dimensions of the chip carrier, and the separation distance of the diodes from the heatsink.

It is, therefore, apparent that there has been provided, in accordance with the present invention, a method for determining the relative dimensional requirements for a dual diode laser in order to produce a dual diode apparatus having minimal thermal crosstalk between diodes mounted on opposite sides of a chip carrier. While this invention has been described in conjunction with preferred embodiments thereof, it is evident that many alternatives, modifications, and variations will be apparent to those skilled in the art. Accordingly, it is intended to embrace all such alternatives, modifications and variations that fall within the spirit and broad scope of the appended claims.

What is claimed is:

1. A multispot laser, comprising:
   a pair of laser diodes;
   supporting means, having at least two opposed sides, for supporting said laser diodes on each of the two opposed sides, wherein said supporting means conducts thermal energy away from said laser diodes during operation of said laser diodes; and
   means, coupled to said supporting means, for dissipating the thermal energy, where said laser diodes each include an emitter positioned at a distance h from said dissipating means and exhibit a temperature dependent response $T_{og}$, and
   said supporting means comprises a material having a thermal conductivity k, a heat capacity $c_p$, a thickness dimension r, and a height dimension of at least 2h, with the thickness and height dimension of said supporting means being controlled so that a minimum dimensional spacing ratio, r/h, is at least equal to a predefined level, the predefined level being determined as a function of the thermal conductivity k, the heat capacity $c_p$, and the temperature dependent response of said laser diodes, $T_{og}$.

2. The multispot laser of claim 1, wherein said supporting means comprises a rigid material selected from a group consisting of
type IIA diamond,
oxygen-free high conductivity copper,
beryllium oxide, and
silicon.

3. The multispot laser of claim 1, wherein:
said pair of laser diodes comprises first and second laser diodes, both adapted to provide a maximum of 10 milliwatts of optical output; and
said supporting means conducts the thermal energy generated by said first and second laser diodes so as to limit thermal crosstalk between said first and said second laser diodes to a maximum optical output change of one percent for each of said pair of laser diodes.

4. The multispot laser of claim 3, wherein said supporting means comprises a type IIA diamond material having a thickness r, and wherein said laser diodes are positioned at a distance h from said dissipating means, such that the minimum dimensional spacing ratio r/h is at least 4.

5. The multispot laser of claim 3, wherein said supporting means comprises an oxygen-free high conductivity copper material having a thickness r, and wherein said laser diodes are positioned at a distance h from said dissipating means, such that the minimum dimensional spacing ratio r/h is at least 9.

6. The multispot laser of claim 3, wherein said supporting means comprises a beryllium oxide material having a thickness r, and wherein said laser diodes are positioned at a distance h from said dissipating means, such that the minimum dimensional spacing ratio r/h is at least 12.

7. The multispot laser of claim 3, wherein said supporting means comprises a silicon material having a thickness r, and wherein said laser diodes are positioned at a distance h, from said dissipating means, such that the minimum dimensional spacing ratio r/h is at least 26.

8. The multispot laser of claim 1, wherein:
said laser diodes each include an emitter positioned at a distance h from said dissipating means, and exhibit a temperature dependent response which is limited so as not to exceed a predefined magnitude; and
said supporting means includes a material having a thickness r and an overall size constrained by a relationship between the thickness r and the distance h, said relationship being determined as a function of the thermal energy generated, a heat capacity of said supporting means and the predefined magnitude.

9. The multispot laser of claim 8, wherein said predefined magnitude is a function of the optical operating power of said laser diodes.

10. The multispot laser of claim 1, wherein said laser diodes comprise a junction layer and a substrate layer affixed in back-to-back contact with a first surface of said junction layer, with a second surface of the junction layer contacting said supporting means.

11. The multispot laser of claim 10, wherein said supporting means comprises a three layer element, including:
an inner layer; and
a pair of conductive outer layers with said inner layer being interposed between said conductive outer layers and affixed thereto, said outer layers being interposed between the junction layer of each of said laser diodes and said inner layer to electrically couple the junction layer of said laser diodes.

12. The multispot laser of claim 11, wherein said inner layer is selected from the group consisting of type IIA diamond, beryllium-oxide, and silicon.

13. The multispot laser of claim 1, wherein one of said laser diodes comprises a monolithic multispot laser diode.

14. The multispot laser of claim 1, wherein:
said supporting means has a cross-sectional area through which the thermal energy is conducted;
said dissipating means includes a contact area between said dissipating means and said support means; and
said contact area being at least equal to the cross-sectional area of said supporting means.

15. A printing machine having a photoreceptor which is exposed by a raster output scanning arrangement which comprises:
a multispot least, including:
a first laser diode for producing a first beam,
a second laser diode for producing a second beam,
supporting means, having at least two opposed sides, for supporting said first and second laser diodes on one of the opposed sides, wherein said supporting means conducts thermal energy away from said first and second laser diodes during operation of said laser diodes, and
means, coupled to said supporting means, for dissipating the thermal energy, wherein said first and second laser diodes each include an emitter positioned at a distance h from said dissipating means and exhibit a temperature dependent response $T_{og}$, and
said supporting means comprises a material having a thermal conductivity k, a heat capacity $c_p$, a thickness dimension r, and a height dimension of at leas 2h, with the dimension of said supporting means being controlled so that a minimum dimensional spacing ratio, r/h, is at least equal to a predefined level, the predefined level being determined as a function of the thermal conductivity k, the heat capacity $c_p$ and the temperature dependent response of said laser diodes, $T_{og}$;
means for deflecting the first and second beams into an optical path; and
means for directing the first and second beams toward a surface of the photoreceptor.

16. The printing machine of claim 15, wherein said supporting means comprises a rigid material selected from a group consisting of,
type IIA diamond,
oxygen-free high conductivity copper,
beryllium oxide, and
silicon.

17. The printing machine of claim 15, wherein:
said first and said second laser diodes are adapted to provide a maximum of 10 milliwatts of optical output; and said supporting means conducts the thermal energy generated by said first and second laser diodes so as to limit thermal crosstalk between said first and said second laser diodes to a maximum optical output change of one percent for said first and second laser diodes.

18. The printing machine of claim 17, wherein said supporting means comprises a type IIA diamond material having a thickness r, and wherein said laser diodes are positioned at a distance h from said dissipating means, such that the minimum dimensional spacing ratio r/h is at least 4.

19. The printing machine of claim 17, wherein said supporting means comprises an oxygen-free high conductivity copper material having a thickness r, and wherein said laser diodes are positioned at a distance h from said dissipating means, such that the minimum dimensional spacing ratio r/h is at least 9.

20. The printing machine of claim 17, wherein said supporting means comprises a beryllium oxide material having a thickness r, and wherein said laser diodes are positioned at a distance h from said dissipating means, such that the minimum dimensional spacing ratio r/h is at least 12.

21. The printing machine of claim 17, wherein said supporting means comprises a silicon material having a thickness r, and wherein said laser diodes are positioned at a distance h from said dissipating means, such that the minimum dimensional spacing ratio r/h is at least 26.

22. The printing machine of claim 15, wherein said first and second laser diodes comprise a junction layer and a substrate layer affixed in back-to-back contact with a first surface of the junction layer, with a second surface of the junction layer contacting said supporting means.

23. The printing machined of claim 22, wherein said supporting means comprises a three layer element, including:
an inner layer; and
a pair of conductive outer layers with said inner layer being interposed between said conductive outer layers and affixed thereto, said outer layers each being interposed between the junction layer of one of the laser diodes and said inner layer to electrically couple the junction layers of each of said layer diodes.

24. The printing machine of claim 23, wherein said inner layer is selected from a group consisting of type IIA diamond, beryllium-oxide, and silicon.

25. The printing machine of claim 15, wherein said first laser diode comprises a monolithic multispot laser diode.

* * * * *